United States Patent [19]

Schneider et al.

[11] Patent Number: 5,324,362

[45] Date of Patent: Jun. 28, 1994

[54] APPARATUS FOR TREATING SUBSTRATES IN A MICROWAVE-GENERATED GAS-SUPPORTED PLASMA

[75] Inventors: Guenter Schneider, Besigheim; Gerhard Benz, Boeblingen, both of Fed. Rep. of Germany

[73] Assignee: Robert Bosch GmbH, Stuttgart, Fed. Rep. of Germany

[21] Appl. No.: 917,133

[22] PCT Filed: Jan. 10, 1991

[86] PCT No.: PCT/DE91/00018

§ 371 Date: Aug. 10, 1992

§ 102(e) Date: Aug. 10, 1992

[87] PCT Pub. No.: WO91/12353

PCT Pub. Date: Aug. 22, 1991

[30] Foreign Application Priority Data

Feb. 9, 1990 [DE] Fed. Rep. of Germany ....... 4003904

[51] Int. Cl.⁵ .................. C23C 16/50; C23C 14/00
[52] U.S. Cl. ................ 118/723 MP; 118/723 AN; 118/723 VE; 204/298.38
[58] Field of Search ....... 118/723, 723 MW, 723 ME, 118/723 MR, 723 MA, 723 AN; 156/345; 204/298.37, 298.38

[56] References Cited

U.S. PATENT DOCUMENTS

| | | | |
|---|---|---|---|
| 4,085,248 | 4/1978 | Zehender et al. | 428/336 |
| 4,339,326 | 7/1982 | Hirose et al. | 118/723 X |
| 4,683,838 | 8/1987 | Kimura et al. | 118/723 X |
| 4,745,337 | 5/1988 | Pichot et al. | 204/298.317 X |
| 4,939,424 | 7/1990 | Kieser et al. | 315/111.21 |
| 5,126,635 | 6/1992 | Doehler et al. | 118/723 X |
| 5,180,436 | 1/1993 | Ueda et al. | 118/723 |

FOREIGN PATENT DOCUMENTS

| | | |
|---|---|---|
| 0279895 | 8/1988 | European Pat. Off. . |
| 2625448 | 12/1977 | Fed. Rep. of Germany . |
| 2328025 | 6/1976 | France . |
| 63-103089 | 5/1988 | Japan . |

Primary Examiner—R. Bruce Breneman
Assistant Examiner—Jonathan D. Baskin
Attorney, Agent, or Firm—Spencer, Frank & Schneider

[57] ABSTRACT

An apparatus for treating substrates, in particular for applying a protective layer to the surface of optical reflectors (17) in a microwave-generated gas-supported plasma (16), which comprises a vacuum bell jar (1, 2), which is preferably of drum-type design and has a gas inlet (6), for receiving the substrates (17) to be treated. The vacuum bell jar has a passage window (7) sealed by a quartz-glass pane (8) or the like, for the microwave energy generated by a generator (11) disposed outside the bell jar (1, 2). The microwave energy is injected into the interior of the bell jar (1, 2) by a microwave aerial (12) adjoining the window (7).

13 Claims, 1 Drawing Sheet

APPARATUS FOR TREATING SUBSTRATES IN A MICROWAVE-GENERATED GAS-SUPPORTED PLASMA

PRIOR ART

German patent specification 2 625 448 discloses a method by which optical reflectors, preferably headlight reflectors vapour-coated with aluminium, can be protected against corrosion by a plasma polymer layer. For this purpose, the reflectors are exposed in a vacuum bell jar to a monomeric vapour of organic compounds, preferably an organosilicon substance, and the protective layer is deposited by polymerisation from the vapour phase with the aid of radiation from a non-self-maintained glow discharge using a tungsten filament wire. The deposition rates which can be achieved by this method are frequently insufficient to achieve the minimum layer thickness necessary for an increased resistance to condensation water. Moreover, it is necessary to ensure not only that a minimum layer thickness is deposited, but that a maximum layer thickness is not exceeded at particularly exposed points, for example at plane surfaces of the reflector. Troublesome interference colours may otherwise be produced from a maximum layer thickness of approximately 70 nm upwards because the phase condition for destructive interference of blue light is fulfilled (refractive index of the protective layer $n \approx 1.5$). The reflector does therefore not meet the quality requirements. For this reason, the ratio between maximum protective layer thickness, for example at the front surface plane areas, and minimum thickness, for example in the neck region of the lamp must be not more than 2.8:1 even in the case of deep-drawn reflectors. Otherwise, the required resistance to condensation water over several hundred hours without optical impairment as a result of variegated interference colours cannot be achieved.

This condition can frequently not be fulfilled with the specified method (incandescent tungsten wire—non-self-maintained glow discharge). The reason for the inadequacy of the layer thickness distribution in some cases is the relatively high process pressure necessary for an economical deposition of the layers, which is in the order of magnitude of $10^{-3}$–$10^{-2}$ mbar and at which the free path length of the reactive species is less than the extension in depth of the reflector to be coated. A further disadvantage of this method is the relatively high expenditure due to the consumption of tungsten filament wires.

The literature discloses plasma-generated methods which have a particularly high efficiency and which permit, in principle, a reduction in pressure down to approximately $10^{-5}$ mbar. These include electron cyclotron resonance plasma generation (ECR) at excitation frequencies in the gigahertz range. Since the free path length of the reactive species at these low process pressures becomes much larger than the extension in depth of the parts to be coated, a profound improvement in the layer thickness distribution on the reflectors is expected.

German Offenlegungsschrift 37 05 666 has disclosed a device for generating a plasma and for treating substrates therein. The plasma generated with the aid of microwaves serves to coat a substrate which is situated in an evacuable housing. With the aid of permanent magnets mounted in the vicinity of the substrate to be coated it is possible to generate inside the housing an electron cyclotron resonance which makes possible a locally controlled triggering of the plasma (German Offenlegungsschrift 37 05 666 deals with the principles of electron cyclotron resonance in detail so that it is not necessary to go into them here). To couple the microwaves in, there is constructed in a side wall of the housing a large rectangular window which extends in the longitudinal direction of the same and which is hermetically sealed by a quartz-glass pane. For this purpose, the housing has to be cut open over virtually its entire length. Mounted behind the window at a very small distance from the substrates to be coated is a closed magnet configuration in order to generate an ECR plasma at that point. The apparatus is also suitable for coating markedly three-dimensional objects.

SUMMARY AND ADVANTAGES OF THE INVENTION

In contrast, the apparatus according to the invention wherein the microwave energy is injected into the interior of the bell jar by a microwave aerial adjacent to the window has the advantage that the bell jar does not suffer any noticeable weakening as a result of a perforation which serves as the microwave window since the window can be kept relatively small. In particular, the microwave window can also readily be introduced into an existing bell jar at a later date. The microwave energy generated in a microwave transmitter is distributed in the bell jar by a microwave aerial adjoining the window on the inside, which is covered with quartz glass or the like. This makes it possible to use the space available in the bell jar optimally for accommodating the substrates to be coated. This applies, in particular, to substrates which have been inserted in a known manner in the planetary cages of a drum-type loading carriage which is introduced into the bell jar through a door. In this case, the coating source is disposed at a relatively large distance from the substrates to be coated, and this is also advantageous in relation to a beneficial layer thickness distribution on deep-drawn substrates. In addition, the coating can be carried out within a large solid angle. This markedly shortens the coating time needed per charge at the same process pressure.

Further measures are disclosed which provide advantageous further developments and improvements of the basic apparatus. It is particularly advantageous to design a microwave aerial, which adjoins the window in the interior of the bell jar, as a waveguide which extends in a space-saving manner in the direction of the longitudinal axis of the vacuum bell jar.

To reduce the microwave power density at the vacuum window, it is beneficial to perform a cross-sectional transformation of the microwave waveguide at that point and to couple on the latter with an increased cross section. This waveguide simultaneously protects the inside of the vacuum window against contamination if the substrates are subjected to a metal vapour coating, for example an aluminium vapour coating, prior to their plasma polymer coating. The use of a magnet bank which extends parallel to the microwave aerial makes possible a locally limited electron cyclotron resonance which brings about a particularly homogeneous distribution of the plasma over the entire longitudinal axis of the vacuum bell jar at very low process pressure. This magnet bank is advantageously composed of permanent magnets in such a way that adjacent rows of magnets have an alternating polarity.

It is particularly advantageous to mount the window in a demountable lid which seals an opening of the end wall. In this way, the bell jar itself remains free of perforations for the microwave window. The lid is expediently disposed in the centre of the end wall. The coating source can thus also be mounted in the centre or near the centre of the bell jar at an adequate distance from the substrates to be coated.

BRIEF DESCRIPTION OF THE DRAWING

Details and further features of the invention emerge from the drawing and the description below, an exemplary embodiment of the invention being shown in the drawing.

DESCRIPTION OF THE EXEMPLARY EMBODIMENT

Figure 2:
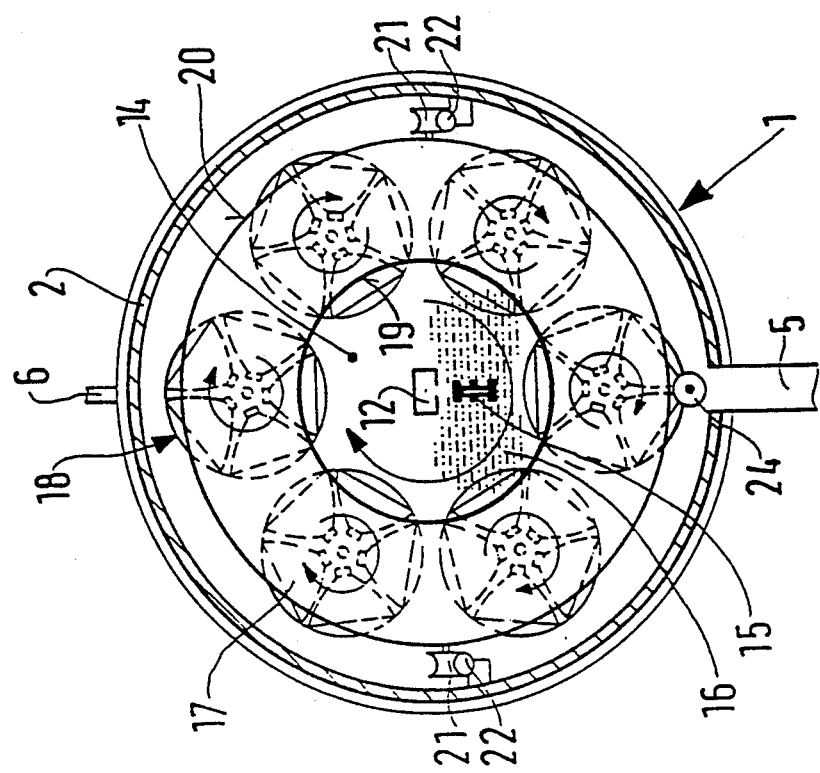
FIG. 2 shows a cross section of the apparatus in accordance with FIG. 1.

In the figures, 1 denotes a vacuum bell jar which has an elongated cylindrical housing 2 which is closed off at each of the end faces by a wall 3 or 4. The end wall 4 is designed as a hermetically sealable door which, in the open position, makes it possible to load the bell jar 1 with the substrates to be treated. The housing 2 can be evacuated via a nozzle 5 which is connected to a pump which is not shown. The substrate is coated by means of a monomeric vapour which is introduced into the housing 2 via an inlet nozzle 6 and is ionised therein. The monomer or the monomer mixtures are preferably the chemical compounds, specified in German patent specification 2 625 448, selected from the group comprising the siloxanes and the silanes.

The other end wall 3 of the housing 2 is provided with a passage window 7 for microwave energy, which window is sealed by a pane 8 of material, for example quartz glass, which is transparent to microwave radiation. The window 7 is formed in a demountable lid 9 which seals an access opening 10 to the interior of the housing. In the exemplary embodiment, the opening 10 is disposed in the centre of the end wall 3 and the window 7 in the centre of the lid 9.

Figure 1:
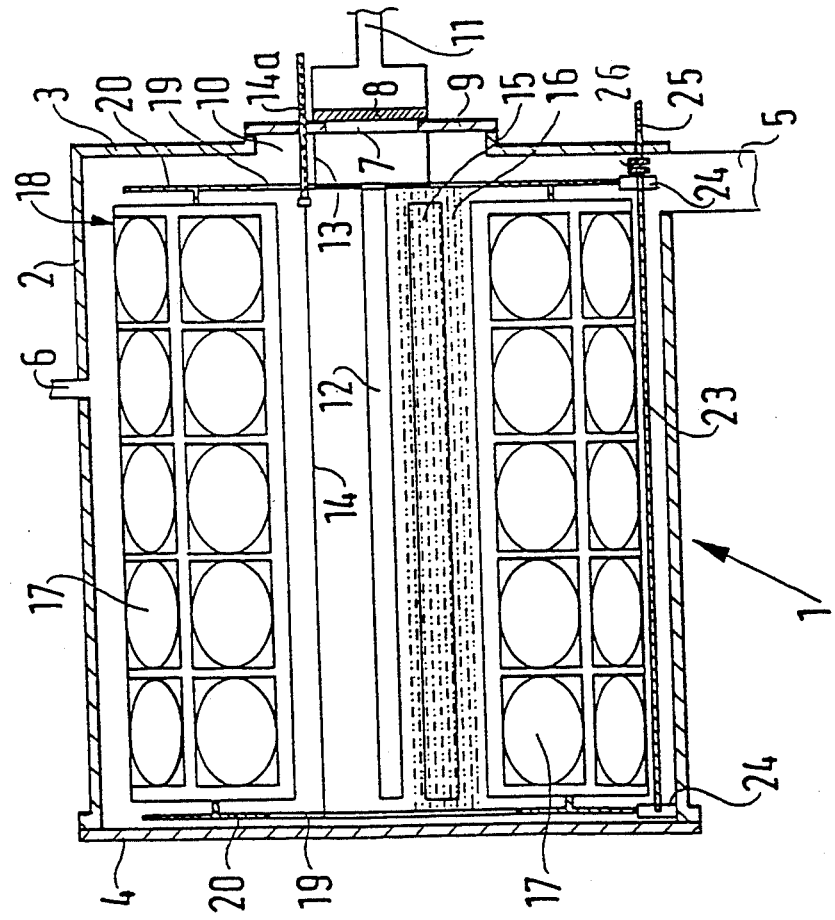
FIG. 1 shows a longitudinal section of a diagrammatically depicted apparatus for treating headlamp reflectors.

The radiation generated by a microwave generator 11 is coupled in through the pane 8 and the window 7 via a microwave aerial 12. In principle, many designs, such as horn radiators, slot aerials or aerials with coupling pins, are conceivable for the microwave aerial. As is evident from FIG. 1, the microwave aerial is designed as a centrally disposed tube which extends in the direction of the longitudinal axis of the housing 2. The microwave aerial 12 is attached on one side to the inside of the lid 9 by its end piece 13 of cap-type design, this waveguide 13 completely covering the window 7 and the pane 8. This prevents deposits which reflect the injected microwaves and thereby adversely affect the performance from being able to form on the pane. Such a protection of the pane is important, in particular, if the substrates to be coated are vapour-coated with a metal layer, in particular an aluminium layer, in the same bell jar as is necessary and usual, for example, for headlamp reflectors. An evaporator wire associated with such an evaporation plant is shown in the figures and denoted by 14. It is connected to a current source situated outside the bell jar. A current supply lead 14a for the evaporator wire 14 is fed through the lid 9 outside the window 7 and the pane 8.

Disposed parallel to the microwave aerial 12 and at a small distance from the latter is a bar-type magnet bank 15. Said magnet bank generates a suitable magnetic field which fulfils the electron cyclotron resonance condition. Under these circumstances, the electrons generated by ionisation of the monomer molecules in the microwave field are forced into spiral tracks around the magnetic field lines because of the Lorenz force. This increases the probability of ionisation for the gas molecules at the desired low process pressure. The magnet bank 15 is mounted on a loading carriage which is described in greater detail below.

In detail, the magnet bank has a bar-type support composed of a magnetically soft material having two mutually opposite, parallel plane surfaces on which, in the exemplary embodiment, three individual rows of magnets are each disposed equidistantly from one another, the pole ends of said individual rows of magnets being different in terms of polarity from the pole ends of the respectively adjacent individual row of magnets.

If the ECR condition is fulfilled (magnet flux density $B=87.5$ mT at a microwave frequency of $f=2.45$ GHz), a plasma is triggered in the two hatched zones 16. If a polymerisable monomer such as hexamethyldisiloxane (HMDS(O)) is introduced, a glow-discharge polymer protection layer can consequently be deposited.

The principle is therefore to install a suitable magnet bank in the vacuum bell jar instead of a tungsten filament wire. This makes the electrical connection, hitherto necessary for the heating and for the high-voltage supply, unnecessary. Microwave energy is injected into the plant via microwave radiation elements which are known per se and is therefore "latently" present. At the same time, the process pressure is set so low that a plasma is not as yet triggered through normal collision avalanche processes because of Paschen's law. It is only the vicinity of the magnet bank, where the cyclotron resonance condition is fulfilled, that a "resonant plasma discharge" takes place. Consequently, the plasma distribution over the length of the plant is not generated by a homogeneous microwave field distribution which can only be achieved with difficulty in practice, but by a suitable magnetic field. In relation to the process pressure, this concept means that the apparatus should be operated at pressures p of less than $10^{-3}$ mbar. As expected, the low process pressure makes possible a better layer thickness distribution of the glow polymer protection layer on deep reflectors: the experimental value for the layer thickness ratio between front surface plane area and lamp neck region is $<2:1$.

The substrates to be coated are headlamp reflectors 17. In each case a plurality of these is inserted in a known manner in the planetary cages 18 having a cylindrical external contour, which planetary cages are in turn rotatably mounted between two discs 20 each having a circular central cutout 19. The discs 20 are rotatably mounted in a frame, which is not shown and which is provided with two mutually diametrically opposite roller systems 21. Each roller system has a running rail 22 mounted on the inside of the housing 2. The loading carriage having the parts 18 and 20 can be introduced into the housing 2 and withdrawn from it on said rails in a cantilever manner with the aid of the rollers 21.

The two discs are driven by one roller (or gear) each, which is mounted on a shaft 23 and which engages with the outer circumference of the disc. The drive of the cages 18 can also be initiated by the rotary movement of the discs 20. The shaft 23 is driven by a motor shaft via a clutch 26.

As is clearly evident from the figures, the apparatus utilises the free space present in any case in the interior of the loading carriage for accommodating the coating source 12, 15. The parts 12, 15 do not therefore require any additional spacing in the housing 2. As emerges from FIG. 2, the plasma generated by the coating source 12, 15 covers a solid angle of approximately 180°. As a result, at least two rows of reflectors are coated simultaneously, and this markedly shortens the coating time. A protection of the pane 8 against vapour coating by aluminium using additional screens or the like is unnecessary since the microwave waveguide covers the pane. As a result of the coating source system described, existing plants can also be converted without difficulty to the ECR method.

We claim:

1. Apparatus for treating substrates, in particular for applying a protective coating to the surface of optical reflectors in a microwave-generated gas-supported plasma, comprising: a vacuum bell jar for receiving the substrates to be treated which vacuum bell jar has a gas inlet and a passage window, which is sealed by quartz glass or the like, for the microwave energy generated by a generator disposed outside the bell jar; a microwave aerial disposed adjacent to the window for injecting the microwave energy into the interior of the bell jar, with the microwave aerial having a waveguide section which covers the window formed in the vacuum bell jar from the inside; and a magnet bank which is arranged within the vacuum bell jar and which acts together with the microwave aerial for producing a local electron cyclotron resonance.

2. Apparatus according to claim 1 wherein one end of the microwave aerial comprises a waveguide which extends in the direction of the longitudinal axis of the vacuum bell jar.

3. Apparatus according to claim 1 wherein one end of the microwave aerial is attached to the inside of the vacuum bell jar.

4. Apparatus according to claim 1 wherein said magnet bank is a bar-type magnet bank, which extends parallel to the microwave aerial.

5. Apparatus according to claim 4 wherein the magnet bank comprises a permanent magnet system which has a bar-type support composed of magnetically soft material having two parallel, mutually opposite plane surfaces on which individual rows of magnate are each disposed equidistantly from one another, the pole ends of said individual rows of magnets being different in terms of polarity from the pole ends of the respectively adjacent individual row of magnets.

6. Apparatus according to claim 1, wherein the window which makes possible the passage of the microwave energy into the interior of the bell jar is formed in an end wall of the bell jar.

7. Apparatus according to claim 6, wherein the window is disposed in the central region of the end wall.

8. Apparatus according to claim 6, wherein the window is formed in a demountable lid which seals an opening of the end wall.

9. Apparatus according to claim 6, wherein at least one electrically heated evaporator wire for a primary metal evaporation coating of the substrates to be coated is disposed in the vacuum bell jar, with current supply leads of said evaporator wire being passed through the end wall of the bell jar containing the window.

10. Apparatus according to claim 9, wherein: the window is formed in a demountable lid which seals an opening of the end wall; and feedthrough holes for the current supply leads are provided in the lid.

11. Apparatus according to claim 1, wherein said bell jar is of drum-type construction.

12. Apparatus for treating substrates, in particular for applying a protective coating to the surface of optical reflectors in a microwave-generated gas-supported plasma, comprising: a vacuum bell jar for receiving the substrates to be treated with said vacuum bell jar having a gas inlet and a passage window, which is formed in an end wall of said bell jar and is sealed by quartz glass or the like, for the microwave energy generated by a generator disposed outside the bell jar; a microwave aerial disposed adjacent to the window for injecting the microwave energy into the interior of the bell jar; a magnet bank which is arranged within the vacuum bell jar and which acts together with the microwave aerial for producing a local electron cyclotron resonance; and at least one electrically heated evaporator wire for a primary metal evaporation coating of the substrates to be coated disposed in the vacuum bell jar, with current supply leads of said evaporator wire being passed through the end wall of the bell jar containing the window.

13. Apparatus according to claim 12, wherein: the window is formed in a demountable lid which seals an opening of the end wall; and feedthrough holes for the current supply leads are provided in the lid.

* * * * *